United States Patent
Sato et al.

[19]

[11] Patent Number: 5,869,919
[45] Date of Patent: Feb. 9, 1999

[54] AIR COOLING FOR FLAT PANEL DISPLAYS

[75] Inventors: Yasue Sato, Kawasaki; Shinichi Kawate, Sagamihara; Hisanobu Azuma, Isehara, all of Japan

[73] Assignee: Canon Kabushiki Kaisha, Tokyo, Japan

[21] Appl. No.: 820,352

[22] Filed: Mar. 12, 1997

Related U.S. Application Data

[63] Continuation of Ser. No. 467,167, Jun. 6, 1995, abandoned.

[30] Foreign Application Priority Data

| Jun. 9, 1994 | [JP] | Japan | 6-127446 |
| May 23, 1995 | [JP] | Japan | 7-123315 |

[51] Int. Cl.$^6$ ..................................................... H01J 7/24
[52] U.S. Cl. .............................. 313/17; 313/44; 313/496; 313/422; 361/681; 361/688
[58] Field of Search ..................... 313/17, 18, 20, 313/25, 26, 45, 46, 495, 496, 497, 33, 44, 422; 361/681, 687, 688

[56] References Cited

U.S. PATENT DOCUMENTS

| 4,563,617 | 1/1986 | Davidson | 313/513 |
| 4,899,080 | 2/1990 | Vriens et al. | 313/44 |
| 4,952,925 | 8/1990 | Haastert | 340/784 |
| 5,185,554 | 2/1993 | Nomura et al. | 313/495 |
| 5,313,362 | 5/1994 | Hatada et al. | 361/687 |
| 5,345,362 | 9/1994 | Winkler | 361/681 |
| 5,499,868 | 3/1996 | Schainholz | 312/236 |

FOREIGN PATENT DOCUMENTS

| 0377773 | 7/1990 | European Pat. Off. | H01J 29/00 |
| 60-032239 | 2/1985 | Japan | H01J 31/12 |
| 3261024 | 11/1991 | Japan | H01J 1/30 |
| 2 054 950 | 2/1981 | United Kingdom | H01J 29/18 |

OTHER PUBLICATIONS

H. Araki, et al., Electroforming and Electron Emission of Carbon Thin Films, Journal of the Vacuum Society of Japan, vol. 26, No. 1, pp. 22–29 (Jan. 26, 1983).

G. Dittmer, "Electrical Conduction and Electron Emmision of Discontinuous Thin Films", Thin Solid Films, 9, pp. 317–328 (1972). no month.

C.A. Mead, "Operation of Tunnel–Emission Devices", Journal of Applied Physics, vol. 32, No. 4, pp. 646–652 (Apr. 1961).

C.A. Spindt, et al., "Physical Properties of Thin–Film Field Emission Cathodes with Molybdenum Cones", Journal of Applied Physics, vol. 47, No. 12, pp. 5248–5263 (Dec. 1976).

W.P. Dyke, et al., "Field Emission", Advances in Electronics and Electron Physics, vol. 8, pp. 89–185 (1956). no month.

M. Hartwell, et al., "Strong Eectron Emission From Patterned Tin–Indium Oxide Thin Films", International Electron Devices, pp. 519–521 (1975). no month.

*Primary Examiner*—Sandra L. O'Shea
*Assistant Examiner*—Michael Day
*Attorney, Agent, or Firm*—Fitzpatrick, Cella, Harper & Scinto

[57] ABSTRACT

An image display apparatus includes a display panel formed by arranging in juxtaposition a face plate carrying thereon a phosphor and a rear plate carrying thereon electron-emitting devices within a housing. The phosphor is so arranged as to be irradiated with electrons emitted from the electron-emitting devices to display images. The image display apparatus further includes an air blower for causing air to flow between the display panel and the housing.

27 Claims, 10 Drawing Sheets

AIR COOLING FOR FLAT PANEL DISPLAYS

This application is a continuation of application Ser. No. 08/467,167, filed Jun. 6, 1995, now abandoned.

BACKGROUND OF THE INVENTION

1. Field of the Invention

This invention relates to a flat type image display apparatus comprising an electron source.

2. Related Background Art

In recent years, lightweight and slim so-called flat type image display apparatuses are drawing attention and expected to rapidly replace conventional heavy and plumpy display apparatuses that comprise a cathode ray tube. While tremendous research efforts have been paid in the technological development of liquid crystal displays in order to realize a slim and flat profile, they are accompanied by the problem of a rather dark view screen and a limited viewing angle along with other problems. An emission type flat type display apparatus comprising an electron source for emitting electron beams and a phosphor that produces visible images when irradiated with electron beams is advantageous in that it has a bright screen and a wide viewing angle and therefore can adapt itself to a large screen arrangement and highly defined images if compared with a liquid crystal display. The demand for emission type flat panel display apparatuses is remarkably increasing because of these and other advantages.

An emission type flat type image display apparatus that utilizes electron beams for producing images typically comprises a number of electron-emitting devices arranged in the form of a matrix between a face plate and a rear plate. A number of flat type image display apparatuses comprising surface conduction electron-emitting devices for emitting electron beams and a phosphor for displaying images when irradiated by accelerated electron beams have already been disclosed and applied for patent, including those invented by the applicant of the present patent application. (See inter alia Japanese Patent Publication No. 3-261024.)

FIG. 10 of the accompanying drawings is a simplified schematic sectional view of a typical flat type image display apparatus comprising surface conduction electron-emitting devices as mentioned above.

Referring to FIG. 10, the image display apparatus comprises a substrate 1001 made of an insulating material such as soda lime glass, a number of surface conduction electron-emitting devices 1002 arranged on the substrate 1001, an insulation layer 1003 formed on the substrate 1001 and grids 1004, each having a hole for allowing electron beams to pass therethrough and operating as a modulation electrode. The apparatus further comprises a face plate 1005 made of soda lime glass and provided on the inside with a phosphor 1006 covered by a metal back 1007 of aluminum thin film and a lateral frame 1009 disposed between and bonded to said substrate 1001 and said face plate 1005 by means of frit glass 1008 to form a sealed envelope. The surface conduction electron-emitting devices 1002 and the grids 1003 are electrically connected to an external drive circuit (not shown), while the metal back 1007 is electrically connected to a high voltage power source 1013 by way of a high voltage power cable 1014.

FIG. 11 is a perspective view of a surface conduction electron-emitting device 1002, showing its configuration in detail.

Referring to FIG. 11, it comprises a pair of device electrodes 1102 and 1103 separated from each other by a predetermined distance L and a thin film 1104 prepared by applying an organic palladium compound (e.g., ccp-4230: available from Okuno Pharmaceutical Co., Ltd.) onto the device and having an electron-emitting region 1105 produced in the thin film by subjecting the latter to an electrically energizing process called "forming". "Forming" is a process in which a voltage is applied between the device electrodes 1102 and 1103 to partly destruct, deform or modify the composition of the thin film 1104 and to produce an electron-emitting region 1105 which is electrically highly resistant.

The electron-emitting region 1105 may be an area of the thin film 1104 having fissures. If such is the case, electrons are emitted from and near the fissures. Proposed materials that can suitably be used for the thin film of a surface conduction electron-emitting device include $SnO_2$, Au [G. Dittmer: "Thin Solid Films", 9, 317 (1972)], $In_2O_3/SnO_2$ [M. Hartwell and C. G. Fonstad: "IEEE Trans. ED Conf.", 519 (1975)] and carbon [H. Araki et al.: "Vacuum", Vol. 26, No. 1, p. 22 (1983)].

When the internal pressure of the above described image display apparatus is held to about $10^{-6}$ Torr and a drive pulse voltage is applied to the device electrodes 1102 and 1103 of the surface conduction electron-emitting device having a configuration as shown in FIG. 11 by the external drive circuit, the device emits an electron beam. The electron beam then passes through the corresponding grid 1004 and is accelerated by the positive voltage being applied to the phosphor 1006 and the metal back 1007 by the high voltage power source 1013 to eventually collide with the phosphor 1006 and make it emit light. The speed at which the electron beam travels can be controlled by the voltage applied to the grid 1006 by the drive circuit (not shown) so that consequently the fluorescent body may emit light in a controlled manner to produce an intended image on the screen.

Electron-emitting devices other than those of the surface conduction type include those utilizing thermoelectron sources, field emission electron-emitting devices [W. P. Dyke & W. W. Dolan, "Field emission", Advance in Electron Physics, 8, 89 (1956) and C. A. Spindt, "Physical properties of thin-film field emission cathodes with molybdenum cones", J. Appl. Phys., 47, 5248 (1976)] and metal/insulation layer/metal electron-emitting devices [C. A. Mead, "The tunnel-emission amplifier", J. Appl. Phys., 32, 646 (1961)].

In any of the above mentioned image display apparatuses, heat is inevitably generated therein when electrons are made to collide with a phosphor for emission of light, when electron-emitting devices are electrically energized to emit electrons and/or when electron-emitting devices arranged on a plane are sequentially driven to operate by way of wires.

As heat is generated, the substrate 1001 and the face plate 1005 of the apparatus are heated to show a temperature difference between them and/or an uneven thermal distribution within the apparatus, which can in turn result in a differentiated thermal expansion that may give rise to a distorted display screen, a color breakup and/or other problems. These problems will be serious when the image display apparatus has a large display screen.

SUMMARY OF THE INVENTION

It is therefore an object of the present invention to provide an image display apparatus that is free from the above identified technological problems.

Another object of the invention is to provide an image display apparatus that hardly, if any, gives rise to a differentiated thermal expansion in the rear plate and the face plate of the display panel of the apparatus.

Still another object of the invention is to provide an image display apparatus that can stably display high quality images and is free from distortions and the phenomenon of color breakup.

According to the invention, the above objects and other objects are achieved by providing an image display apparatus comprising a display panel formed by arranging in juxtaposition a face plate carrying thereon a phosphor and a rear plate carrying thereon electron-emitting devices within a housing, said phosphor being so arranged as to be irradiated with electrons emitted from said electron-emitting devices to display images, said apparatus further comprising an air blowing means for causing air to flow between the display panel and said housing.

All the above identified technological problems concerning image display apparatuses are resolved by an image display apparatus according to the invention. With an image display apparatus according to the invention and provided with an air blowing means, the face plate and the rear plate exchange heat to reduce the difference of temperature existing therebetween. Additionally, since both the face plate and the rear plate shows an even thermal distribution, any differentiated thermal expansion that may exist in the rear plate and the face plate of the display panel of the apparatus can be minimized.

Thus, an image display apparatus according to the invention can stably display high quality images and remains free from distortions and the phenomenon of color breakup.

The heat discharging effect of the rear plate can be further enhanced to improve the thermal distribution pattern of the display panel by arranging a thermally conductive member having a high thermal conductivity on the rear plate. The thermal distribution pattern of the display panel can be further improved by covering the face plate with a transparent thermally conductive member and physically connecting the thermally conductive members on the face plate and the rear plate by means of a thermally conductive material. With such an arrangement, reflection of ambient light can be reduced and particles of dirt are prevented from being absorbed by the display panel.

DETAILED DESCRIPTION OF THE PREFERRED EMBODIMENTS

Figure 1:
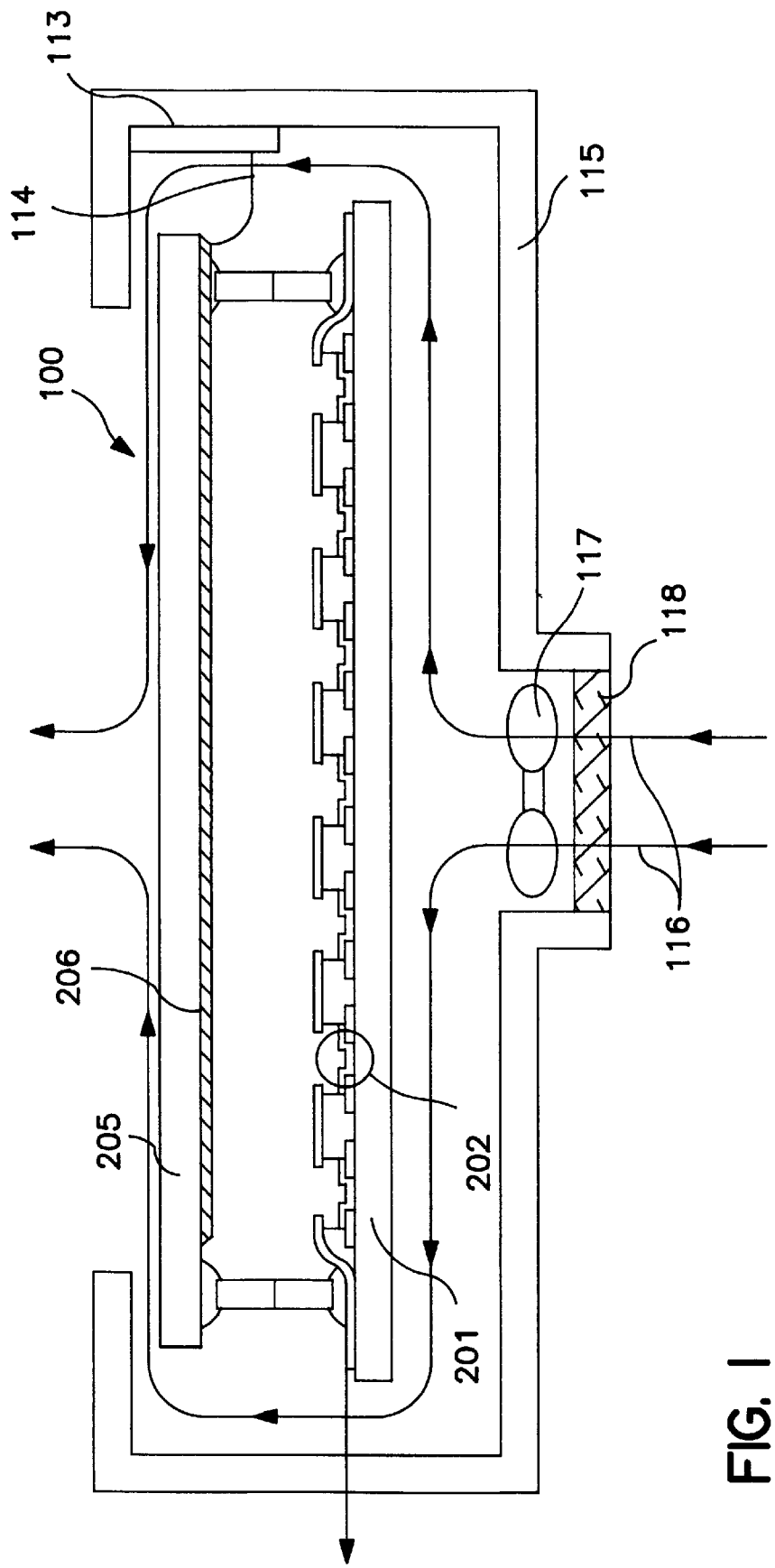
FIG. 1 is a schematic cross-sectional side view of a first embodiment of image display apparatus according to the invention.

Now, the present invention will be described in greater detail by referring to the accompanying drawings that illustrate preferred embodiments of the invention.

A first embodiment of the image display apparatus will be described by referring to FIG. 1, which schematically shows a side view of the embodiment in cross-section. The image display apparatus of FIG. 1 comprises a display panel 100 enclosed in a housing 115. The display panel 100 is prepared by arranging in juxtaposition a face plate 205 carrying thereon a phosphor 206 and a rear plate 201 carrying thereon a number of electron-emitting devices 202. The embodiment additionally comprises a fan (air blowing means) 117 for causing air to flow between the display panel 100 and the housing 115. Said fan 117 draws air from the outside and cause it to flow along arrows 116 as cooling air. While an image display apparatus according to the invention comprises the above components as principal parts thereof, the embodiment of FIG. 1 additionally has a high voltage power source 113, a high voltage cable 114 for feeding the phosphor of the display panel 100 with a high voltage and a filter 118 for removing dirt out of the air drawn into the housing from the outside.

The above embodiment operates to cool the display panel 100 in a manner as described below.

Cooling air is drawn in from the outside by means of the fan 117 fitted to the housing 115 that encloses the display panel 100. The cooling air is then made to pass through the filter 118 to get rid of dirt and flows along the arrowed lines 116 to cool the substrate 201 of the display panel 100 and raise the temperature of itself. Thereafter, the cooling air turns around the face plate 205 of the display panel 100 and exchanges heat with it until the face plate 205 is cooled down close to the temperature of the cooling air. As a result, the rear plate or the substrate 201 of the display panel 100 and the face plate 205 do not practically show any temperature difference and an even thermal distribution throughout the display panel 100 including the face plate 205 and the substrate 201 is realized so that no difference may be observed between the thermal expansion of the face plate 205 and that of the substrate 201 to minimize their thermal distortions and the phenomenon of distorted image and color breakup.

Note that the flow route of cooling air may be reversed and cooling air may be introduced from the side of the face plate 205 and then fed to the substrate 201.

While the position where the air blowing means is fitted to the housing 115 is not particularly specified, a screen cover may preferably be used to cover the opening of the face plate 205 to enhance the efficiency with which it exchanges heat with the cooling air because the cooling air flowing along the face plate 205 is not brought into direct contact with the ambient air.

The heat discharging effect of the rear plate can be further enhanced to improve the thermal distribution pattern of the display panel by arranging a thermally conductive member having a high thermal conductivity on the rear plate. The thermal distribution pattern of the display panel can be further improved by covering the face plate with a transparent thermally conductive member and physically connecting the thermally conductive members on the face plate and the rear plate by means of a thermally conductive material. With such an arrangement, advantageously, reflection of ambient light can be reduced and particles of dirt are prevented from being adsorbed by the display panel.

The thermally conductive member to be arranged on the rear plate is preferably made of a metal having a high thermal conductivity such as Cu or Al, of which Cu is particularly preferable. On the other hand, the thermally conductive member to be arranged on the face plate is preferably made of ITO or $SnO_2$.

While an image display apparatus according to the invention is required to be provided with a drive circuit comprising ICs in order to display images on the display panel, it is also preferable that the drive circuit is cooled at the same time. This can be done without increasing the dimensions of the image display apparatus by arranging the drive circuit somewhere in the flow path of cooling air in such a manner that it does not particularly block the air flow.

The display panel 100 of the above described embodiment is driven to operate by a drive circuit (not shown) that generates a drive signal in response to an image display signal applied to it. Now, the display panel 100 will be described by referring to FIGS. 2, 3A and 3B.

Figure 2:
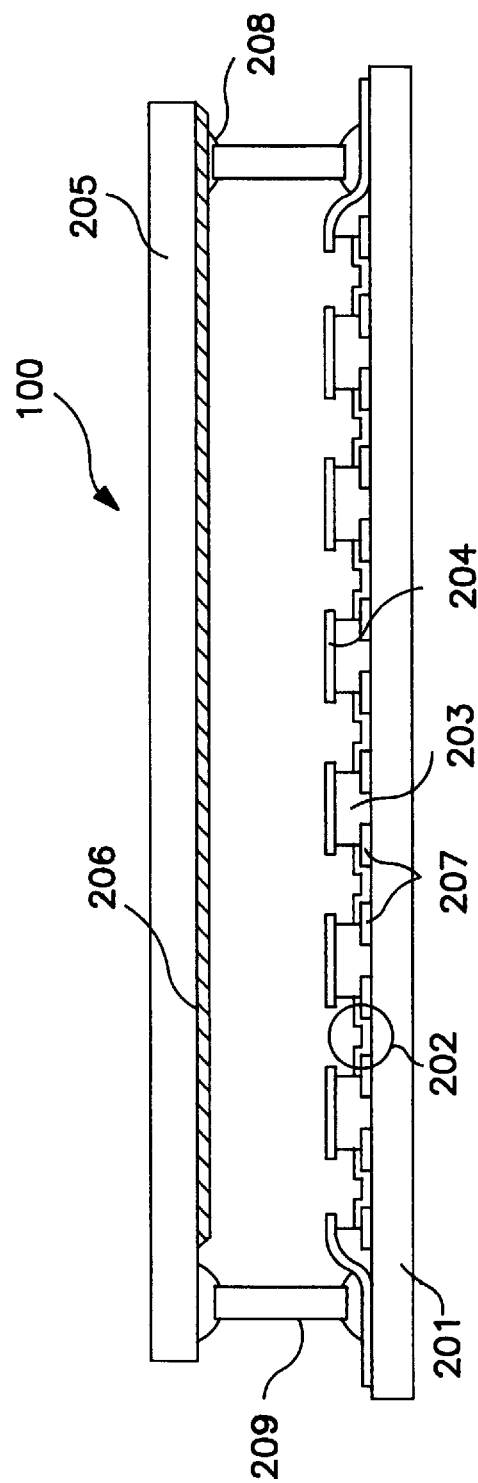
FIG. 2 is a schematic cross-sectional side view of the display panel 100 of FIG. 1.
Figure 3A:
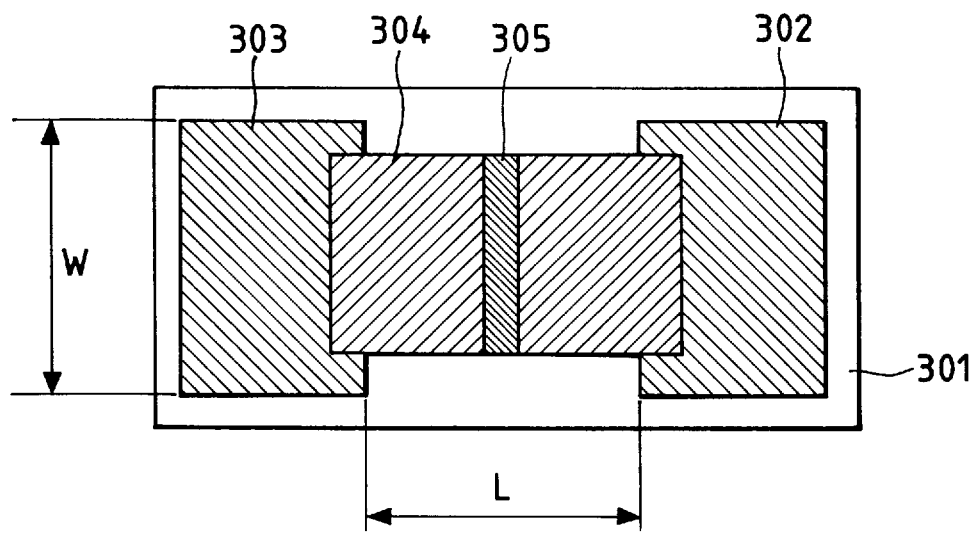
FIGS. 3A and 3B are respectively a schematic plan view and a schematic front view of an electron-emitting device that can be used for an image display apparatus according to the invention.
Figure 3B:
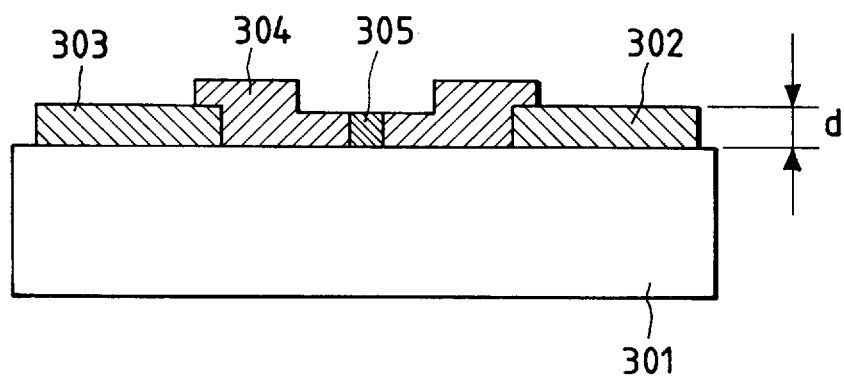

FIG. 2 is a cross-sectional view of the display panel 100 of FIGS. 3A and 3B are respectively a schematic plan view and a schematic front view of one of the surface conduction electron-emitting devices contained in the embodiment. Note that the number of electron-emitting devices 202 is not necessarily limited to that of FIG. 2.

Referring to FIG. 2, the display panel 100 comprises a substrate 201 or a rear plate made of an insulating material such as glass and a number of surface conduction electron-emitting devices 202 as well as insulation layer 203 formed on the substrate 201 and grids 204 formed on the insulation layer 203 and provided with respective holes for allowing electron beams to pass therethrough, each of said grids 204 operating as a modulation electrode. The display panel 100 further comprises a face plate 205 provided with a phosphor 206 on the inner surface thereof which is in turn covered by a metal back made of an Al thin film, said face plate 205 and said substrate 201 being bonded together by means of frit glass 208 with a lateral frame 209 disposed therebetween to produce a vacuum envelope.

The device electrodes 207, the grids 204 and the fluorescent body 206 are electrically extended to the outside of the envelope by wires (not shown) for electric connection.

An electron-emitting device 202 that can be used for the purpose of the invention will now be described in detail by referring to FIGS. 3A and 3B.

As shown in FIGS. 3A and 3B, the electron-emitting device comprises a pair of device electrodes 302, 303 separated by a predetermined distance and an electron-emitting region-containing thin film 304 and an electron-emitting region 305. The electron-emitting region 305 of the electron-emitting region-containing thin film 304 is constituted by electroconductive fine particles having a diameter of tens of several angstroms, whereas the electron-emitting region-containing thin film 304 other than the electron-emitting region 305 is a fine particle film. The term "a fine particle film" as used herein refers to a thin film constituted of a large number of fine particles that may be loosely dispersed, tightly arranged or mutually and randomly overlapping (to form an island structure under certain conditions). The electron-emitting region-containing thin film 304 may be a carbon thin film that contains dispersed electroconductive particles.

Now, the method of manufacturing the above embodiment of image display apparatus will be described.

Firstly, how each of the surface conduction electron-emitting devices 202 is prepared will be described. After thoroughly cleaning a substrate 301, a pair of device electrodes 302, 303 typically of nickel are formed on the substrate 301 by vacuum deposition or photolithography (including techniques such as etching and lift-off) in such a way that they are separated by distance L=2 $\mu$m and have a length W=300 $\mu$m and a thickness d=1,000 Å. Alternatively, the device electrodes may be made of a metal other then nickel or a semiconductor material.

Then, an organic metal thin film is formed between the device electrodes 302 and 303 by applying an organic metal solution. The term "an organic metal solution" as used herein refers to a solution of an organic compound containing as a principal component thereof a metal selected from Pd, Ru, Ag, Au, Ti, In, Cu, Cr, Fe, Zn, Sn, Ta, W, Pb and so on. Thereafter, the organic metal thin film is heated, baked and subjected to a patterning operation by using a technique such as lift-off or etching to produce a thin film 304 having a profile as shown in FIGS. 3A and 3B. Materials that can be used for the thin film 304 are not limited to those listed above and may include metals such as Pd, Ru, Ag, Au, Ti, In, Cu, Cr, Fe, Zn, Sn, Ta, W, Pb and so on, oxides such as PdO, $SnO_2$, $In_2O_3$, PbO, $Sb_2O_3$, borides such as $HfB_2$, $ZrB_2$, $LaB_6$, $CeB_6$, $YB_4$, $GdB_4$ and so on, carbides such as TiC, ZrC, HfC, TaC, SiC, WC and so on, nitrides such as TiN, ZrN, HfN and so on, semiconductor materials such as Si, Ge and so on, carbon, AgMg, NiCu, Pb and Sn. Techniques that can be used for preparing an electron-emitting region-containing thin film 304 include vacuum deposition, sputtering, chemical vapor phase deposition, dispersive application, dipping, spinning and other techniques that can appropriately be used for forming a thin film.

For the purpose of the present invention, thermion sources comprising a hot cathode, field emission electron-emitting devices and other electron sources that can emit electrons may also be used.

Thereafter, wires (not shown) for feeding the semiconductor electron-emitting devices 202 with power are arranged. For this, a film of a metal such as Au, Cu or Al is formed to a thickness of several microns by vapor deposition or sputtering and wires are arranged by photolithography (including techniques such as etching and lift-off) in such a way that they are partly laid on the respective device electrodes 303, 304. The distal ends of the wires are extended to the outside of the envelope for external electric connection. Note that the wires may be arranged by any appropriate technique other than photolithography such as plating or printing using electroconductive paste.

Then, grids 204 and an insulation layer 203 are prepared. For this, an $SiO_2$ film is formed to a thickness of 1 to 5 $\mu$m by sputtering and then an Au, Cu or some other metal film is formed to a thickness of 0.5 to 1 μm by vapor deposition or sputtering. Thereafter, holes larger than the electron-emitting region 305 of the surface conduction electron-emitting device 202 are made by photolithography (including techniques such as etching and lift-off) to allow electrons to pass therethrough and the oxide film that operates as an insulation layer is etched by using the metal film as a mask to produce similar holes. Finally, grids are produced out of the metal layer as it is processed by photolithography (including techniques such as etching and lift-off), said grids having wires that extend out of the envelope for external electric connection.

Subsequently, a face plate 205 prepared by applying a fluorescent material to produce a phosphor 206 and arranging a metal back of aluminum on the phosphor 206 and a substrate 201 carrying thereon a number of surface conduction electron-emitting devices are bonded together with a lateral frame 209 arranged therebetween to produce a display panel by means of frit glass 208, which is heated to a temperature appropriate for the frit glass to hermetically seal the display panel (e.g., 450° C. for LS-0206: available from Nippon Electric Glass Co., Ltd.) for a predetermined period of time (10 minutes for LS-0206). If a color phosphor is used, the pixels of the phosphor 206 have to be aligned with the respective electron-emitting devices on the substrate.

Then, the internal pressure of the display panel 100 is reduced to about $10^{-6}$ Torr by way of an exhaust pipe (not shown) to produce a quasi-vacuum condition and the electron-emitting devices are subjected to an electric forming operation, where the device electrodes 302, 303 are electrically energized. Thereafter, the entire display panel 100 is heated and degassed by flushing it with a getter (not shown). Finally, the exhaust pipe is sealed off to complete the operation of preparing the display panel 100.

An image display apparatus according to the invention is produced when the display panel 100 is placed within a housing 115.

Now, the present invention will be described by way of examples.

(EXAMPLE 1)

An image display apparatus shown in FIG. 1 was produced in a manner as described below.

Firstly, a display panel 100 was prepared. The substrate 201 of the display panel 100 had dimensions of 240 mm×320 mm, whereas the face plate was 190 mm×270 mm large. Each of the surface conduction electron-emitting devices 202 had a configuration as illustrated in FIGS. 3A and 3B and was prepared by arranging a pair of 1,000 Å thick gold device electrodes 302, 303 having a length W=150 μm in juxtaposition and separating them with a distance L=2 μm. Then, a solution containing organic palladium compound (ccp-4230: available from Okuno Pharmaceutical Co., Ltd.) was applied onto the device to produce a thin film 304, which was then heated at 300° C. for 10 minutes to make it a film of fine particles containing palladium as a principal ingredient.

Then, Cu wires (not shown) for feeding the surface conduction electron-emitting device 202 and having a thickness of 2 μm and a width of 150 μm were arranged and grids 204 of gold having a thickness of 1 μm and a width of 800 μm and provided with respective holes of 500 μm×100 μm were formed. $SiO_2$ was used for the insulation layer 203.

Of the above members, the metal film and the $SiO_2$ film were prepared by sputtering and then processed by photolithography (including techniques such as etching and lift-off). The face plate 205 carried a color phosphor 206 of red, green and blue thereon and each of the pixels for one color was 800 μm×250 μm large.

Thereafter, the substrate 201 and the face plate 205 were aligned with each other and bonded together with a lateral frame 209 arranged therebetween to produce a sealed display panel by using LS-0206 available from Nippon Electric Glass Co., Ltd. and heating them at 450° C. for 10 minutes. Thereafter, the display panel was evacuated by way of an exhaust pipe (not shown) to realize a quasi-vacuum condition of $10^{-6}$ Torr. An electric forming operation was carried out on each of the electron-emitting devices to produce an electron-emitting region 305 there by applying a triangular voltage pulse (having a bottom of 1 millisecond, a period of 10 milliseconds and a wave height of 5V) for 60 seconds.

Subsequently, the entire display panel 100 was heated at 130° C. for 24 hours for degassing, flushed with a getter (not shown) and then the exhaust pipe was sealed off to produce a panel section for an image display apparatus. Then, the display panel 100 was arranged within a housing 115 provided with a fan 117 designed to blow air at a rate of 1 $m^3$/minute to finish the image display apparatus.

The above image circuit to display apparatus was driven by means of an external drive circuit to display images according to electric signals applied thereto. No color breakup was observed in peripheral areas of the display screen after a long time of operation and high quality images were displayed on a stable basis.

(EXAMPLE 2)

In this example, a transparent screen cover was arranged on the face plate of an image display apparatus.

Figure 4:
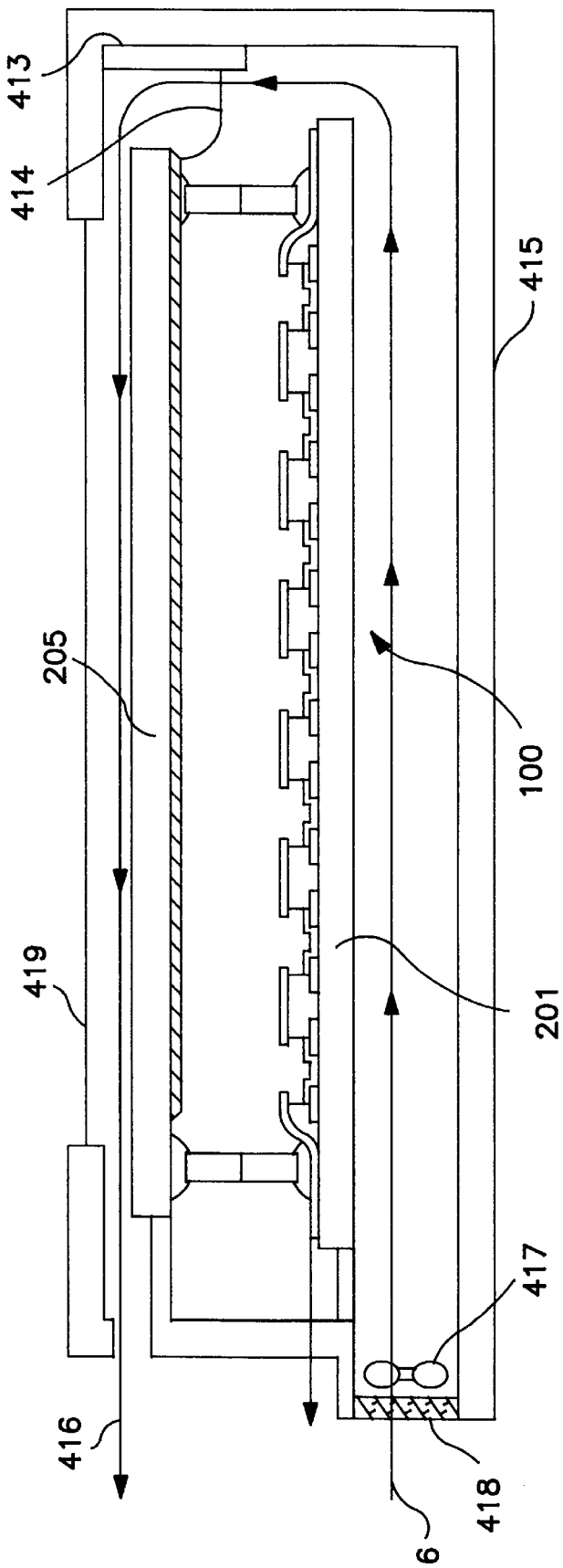
FIG. 4 is a schematic cross-sectional side view of another embodiment of image display apparatus according to the invention and provided with a screen cover.

FIG. 4 shows a schematic cross-sectional view of the image display apparatus of this example.

The display panel 100 had the same configuration as that of Example 1 but was additionally covered by a transparent cover 419. The remaining components of the image display apparatus of this example were the same as the correspondent components of the apparatus of Example 1. More specifically, the high voltage power source 413, the high voltage cable 414, the housing 415, the fan 417 and the filter 418 of this example were respectively the same as the high voltage power source 113, the high voltage cable 114, the housing 415, the fan 117 and the filter 118 of the preceding example.

The screen cover 419 was fitted to the housing 415 on the side where the face plate of the display panel 100 was located. Since air could not be forced out (nor forced in) along the face plate of the display panel 100 of this example, the fan 417 and the filter 418 were arranged at locations on the side (left side in the drawing) of the housing 415 facing the bottom surface of the substrate of the display panel 100. Holes were arranged between the display panel 100 and the screen cover 419 to discharge the cooling air drawn in by the fan 417.

For the purpose of the invention such a screen cover is preferably made of glass or a plastic material, although any other material may be used if it can transmit light coming form the display panel 100. The screen cover 419 may be coated with an anti-reflection optical film or laminated with an anti-scattering plastic film. A screen cover can improve its visibility if treated for anti-reflection and its safety if treated for anti-scattering.

The display panel 100 of the example was prepared and operated for displaying images exactly the same as its counter-part of the first example.

The apparatus of this example operates for cooling in a manner as described below.

As in the case of the first example, air is drawn into the apparatus by means of the fan 417 and cleaned to get rid of dirt by means of the filter 418. The cleaned air is then made to flow along the arrowed line 416 to cool the substrate 201 of the display panel 100 and, in exchange, raises its own temperature. Thereafter, the cooling air turns around the face plate 205 of the display panel 100 and exchanges heat with the face plate 205 as it passes between the face plate 205 and the screen cover 419 so that the temperature of the face plate 205 is lowered close to that of the cooling air.

Since the cooling air is not brought into direct contact with external air because of the screen cover 419, the efficiency of heat exchange of this example was significantly improved when compared with that of the first example.

As a result, the temperature difference between the rear plate or the substrate 201 and the face plate 205 of the display panel 100 was further reduced so that the face plate 205, the substrate 201 and the remaining areas of the display panel showed a very flat temperature profile. Consequently, the difference in the thermal expansion between the plates was significantly reduced and hence they were substantially set free from image distortion and color breakup. The apparatus showed no cracks at all and proved to be highly reliable.

The apparatus of this example will now be described in greater detail.

The display panel 100 was exactly the same as that of the first example and arranged as shown in FIG. 4. A 2 mm thick acryl plate carrying thereon a 0.05 mm thick plastic film for anti-scattering was arranged as a screen cover 419 in front of the face plate 205 with a distance of 1 cm separating them from each other. The fan 417 had a capacity of blowing 1 m³/minute as in the case of the first example.

After driving the display panel to display images by transmitting electric signals from an external circuit for an hour, when the temperature profile of the face plate 205 was stabilized, the temperature of the face plate 205 and that of the substrate 201 were measured to prove that they showed a difference which was substantially the same as the corresponding difference observed in the first example. No color breakup was observed in the peripheral areas of the screen and no damage was noticed in the apparatus.

The blower fan 417 and the filter 418 were arranged on the housing in a manner as illustrated in FIG. 1. One or more than one air outlet ports may be formed through one or more than one walls perpendicular to the face plate 205 and the rear plate 201 for the purpose of the invention. With such an arrangement, the air driven by the blower fan 417 cools the rear plate 401 and thereafter passes by the lateral walls not carrying any air outlet port to get to and cool the face plate 205 before it is driven out through the air outlet ports to produce a remarkable cooling effect.

If a single air outlet port is provided, the air flow within the image display apparatus can be controlled with ease. Thus, such an arrangement is suited for an image display apparatus where sources of heat are localized.

If a plurality of air outlet ports are provided, they are preferably arranged symmetrically relative to the center of the face plate. With such an arrangement, flows of air coming from the rear plate toward the face plate by way of the lateral walls that do not carry an air outlet port collides with each other substantially at the center of the face plate and then are driven out of the air outlet ports. Then, the apparatus will show a remarkably flat temperature profile.

(EXAMPLE 3)

In this example, an image display apparatus comprising thermion sources as electron sources was prepared.

The image display apparatus of this example was the same as that of the first example illustrated in FIG. 1 except that the display panel 100 was configured differently. Therefore, only the display panel 100 of this example will be described hereinafter.

Figure 5:
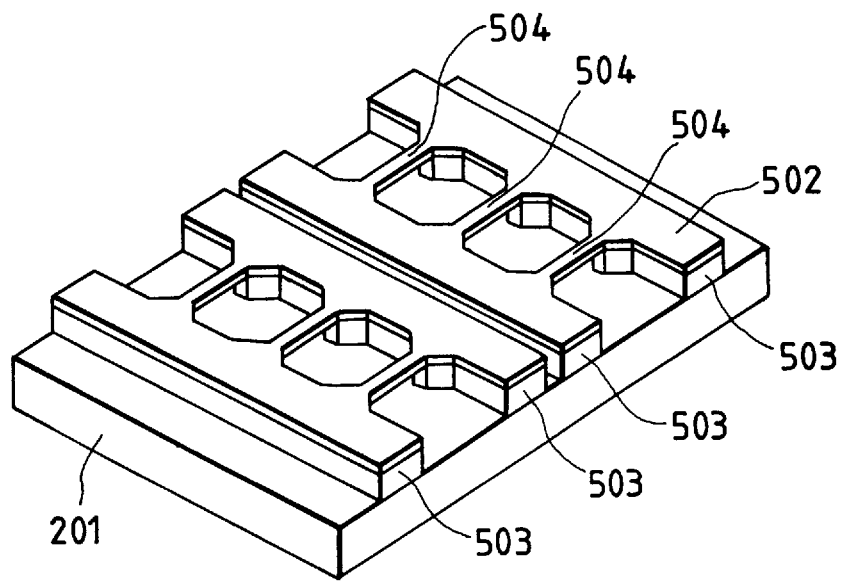
FIG. 5 is a schematic perspective view of an electron source for emitting thermoelectrons that can be used for an image display apparatus according to the invention.

FIG. 5 is a schematic perspective view of the thermion sources of the apparatus of this example.

Figure 6:
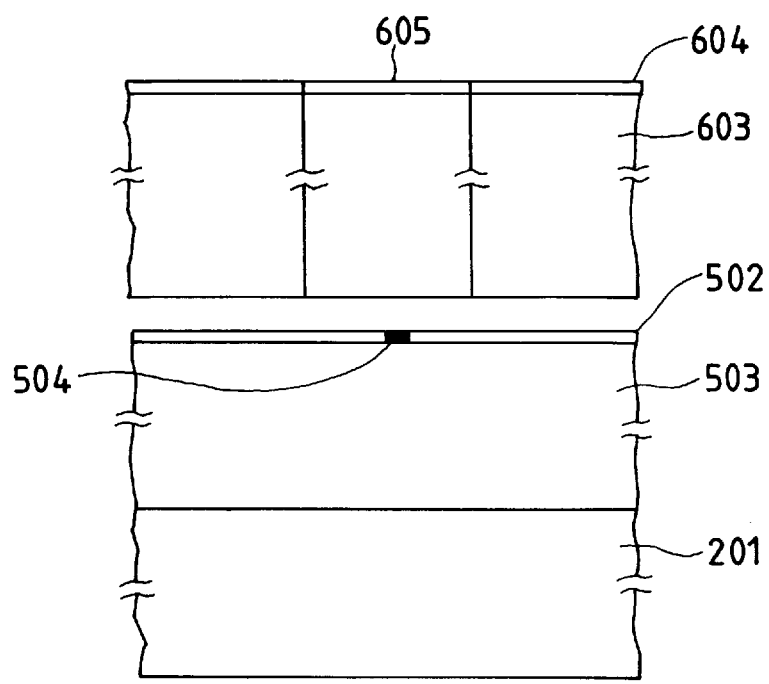
FIG. 6 is a schematic partial view of a thermoelectron-emitting section of a thermoelectron source and a grid, illustrating their positional relationship.

Referring to FIG. 5, the display panel 100 of this example comprised a glass substrate 201, a 1 $\mu$m thick filament layer 502 made of tungsten, a 200 $\mu$m thick and 300 $\mu$m wide electroconductive support layer 503 made of Cu to operate as wires and divided into oblong pieces and a number of thermion-emitting sections 504 for discharging thermions. FIG. 6 illustrates a grid for controlling electron beams in the display panel 100. In FIG. 6, there are shown a 1 millimeter thick insulation substrate 603 made of a photosensitive glass and a 1 $\mu$m thick grid electrode 604 made of Au and adhered to the insulation substrate 603, a 400 $\mu$m×100 $\mu$m hole 605 for allowing electrons to pass therethrough being formed in said insulation substrate 603 and said grid electrode 604 as optically aligned.

The remaining components of the display panel 100 of this example were the same as their counterparts of that of FIG. 2. The face plate 205 of this example was also exactly same as that of the first example as shown in FIG. 1. The thermion-emitting regions 504 of FIGS. 5 and 6 emit thermions as an electric current is made to flow therethrough by way of the eletroconductive support layer 503 and the emitted thermions are modulated by the grids 604 and accelerated by the high voltage applied to the phosphor 206 by means of the high voltage source 113 until they collide with the phosphor 206 and make the latter to emit light and display images.

The display panel 100 of this example had dimensions the same as those of its counterpart of the first example. More specifically, the substrate 201 and the face plate 205 were as large as 240 mm×320 mm and 190 mm×270 mm respectively and the latter carried a phosphor 206 of red, green and blue having pixels for the three colors with dimensions of 800 $\mu$m×250 $\mu$m. Apart from the thermion sources of the substrate 201, both the insulation substrate 603 and the grid electrodes 604 were prepared by forming a metal film by means of sputtering and processing it with photolithography (including techniques such as etching and lift-off). The insulation substrate 603 carrying thereon the grid electrodes 604 were then arranged within the display panel 100 and electrically connected with the outside. Thereafter, the substrate 201 and the face plate 205 were aligned relative to each other with a lateral frame 209 arranged therebetween and bonded together by using LS-0206 available from Nippon Electric Glass Co., Ltd. and heating the components at 450° C. for 10 minutes to hermetically seal the display panel 100 as in the case of the first example. The subsequent steps were also the same as those of the first example.

Then, a fan 117 as shown in FIG. 1 and having a capacity of blowing air at a rate of 1 m³/minute was arranged on the housing 115.

The prepared image display apparatus was then driven to operate by an external drive circuit as it was fed with electric signals from the drive circuit. The substrate generated considerable heat because thermion sources were used. When the temperature profile of the apparatus was stabilized after an hour of operation, the temperature of the face plate 205 and that of the substrate 201 were measured to find that the temperature difference was within ±6° C., which was larger than that of the first example but did not give rise to any color breakup in the peripheral areas of the screen nor damage to the apparatus as a whole.

(EXAMPLE 4)

Figure 7:
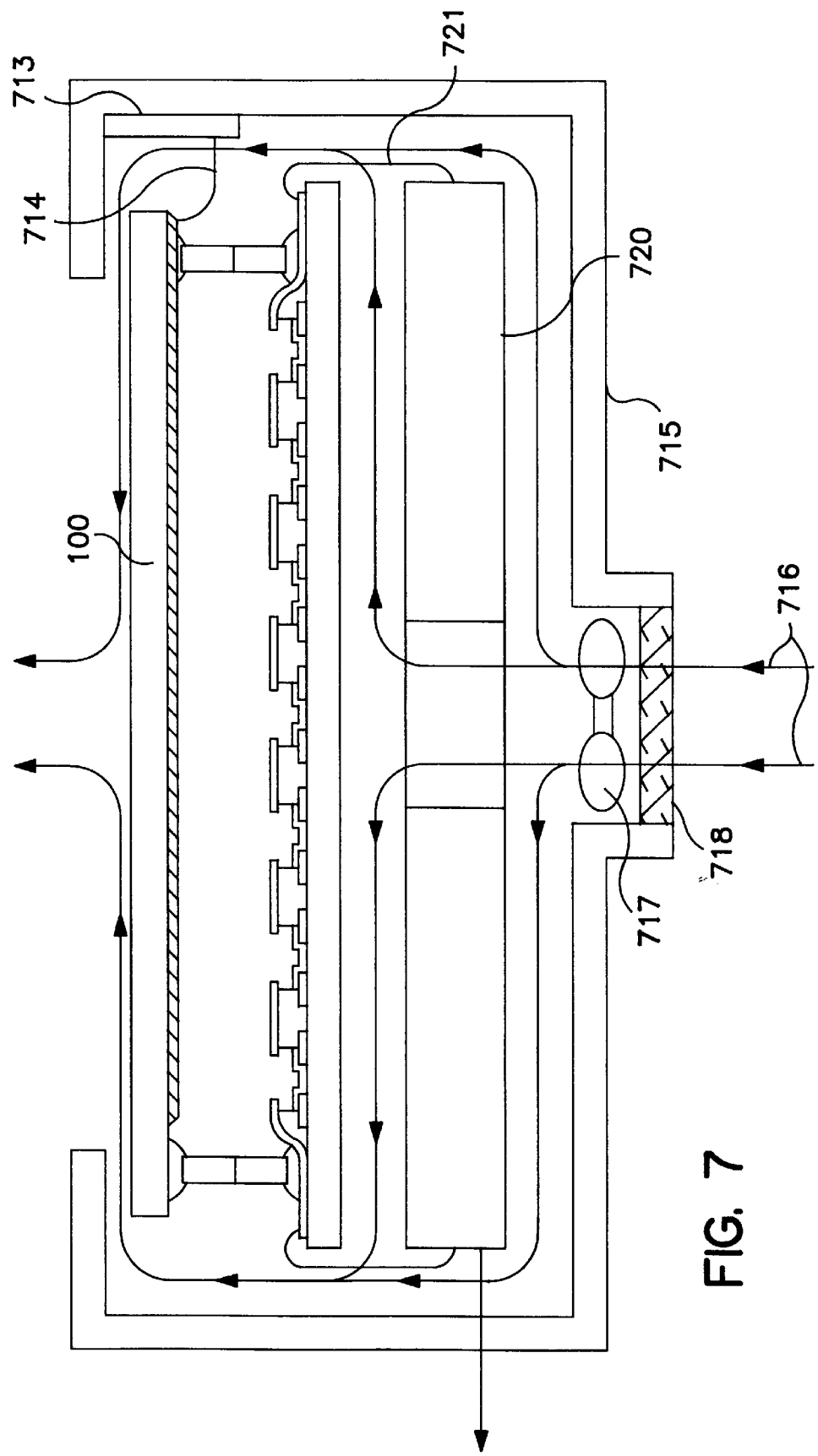
FIG. 7 is a schematic cross-sectional side view of still another embodiment of image display apparatus according to the invention and comprising a built-in drive circuit.

In this example, an image display apparatus comprising an electronic circuit for driving the display panel was prepared. FIG. 7 schematically illustrates the apparatus.

Referring to FIG. 7, the apparatus comprised a housing 715, a fan 717 having a blowing capacity of 4 m$^3$/minute, a drive circuit 720 for electrically driving the electron-emitting devices and the grids and a cable 721 for transmitting electric signals to the electron-emitting devices and the grids.

Otherwise, the apparatus of this example was same as that of the first example in terms of configuration. In FIG. 7, there are shown a display panel 100, a high voltage power source 713, a high voltage cable 714 for feeding the phosphor of the display panel 100 with a high voltage, a housing 715, arrowed lines 716 indicating the flow paths of cooling air, a fan 717 for drawing air from the outside of the display panel and forcing it to flow along the arrowed lines 716 and a filter 718 for removing dirt out of the air drawn in by the fan.

The housing 715 of the image display apparatus of this example enclosed both the display panel 100 and the drive circuit 720 and was provided on the side of the face plate 201 (see FIG. 2) of the screen cover 419 with a large opening for exposing the face plate 201 and substantially at the center on the side of the substrate 201 with a cylindrical sheath for containing the fan 717 and the filter 718.

The drive circuit 720 was, on its part, provided at the center with an opening for allowing cooling air to pass therethrough so that cooling air may flow behind the back side of the drive circuit or between the display panel 100 and the drive circuit 720 toward the face plate 201 of the display panel 100.

With this arrangement, as in the case of the first example, the cooling air drawn in by the fan 717 from the outside is cleaned by the filter 718 to get rid of dirt and then made to flow along the arrowed lines 716 to cool the drive circuit 720 and the substrate 201 of the display panel 100 and raise, in exchange, its own temperature. Thereafter, the cooling air turns around the face plate 205 of the display panel 100 and exchanges heat with the face plate 205 so that the temperature of the face plate 205 is lowered close to that of the cooling air. After an hour of operation, when the temperature profile of the apparatus was stabilized, the temperature of the face plate 205 and that of the substrate 201 were measured to find that they were very close to each other as in the case of the first example. No color breakup was observed in the peripheral areas of the screen and the apparatus was completely free from any damage due to an uneven thermal distribution.

Since the drive circuit of the image display apparatus of this example was enclosed in the housing, the apparatus offered an improved convenience of handling because it operated simply by feeding it with image display signals.

(EXAMPLE 5)

In this example, the face plate was coated on the surface with a thermally conductive transparent film and the rear plate was coated on the surface with a metal film having a thermal conductivity greater than that of the material of the rear plate (soda lime glass) and provided with flat fins. The apparatus of this example will be described hereinafter by referring to FIG. 8.

Figure 8:
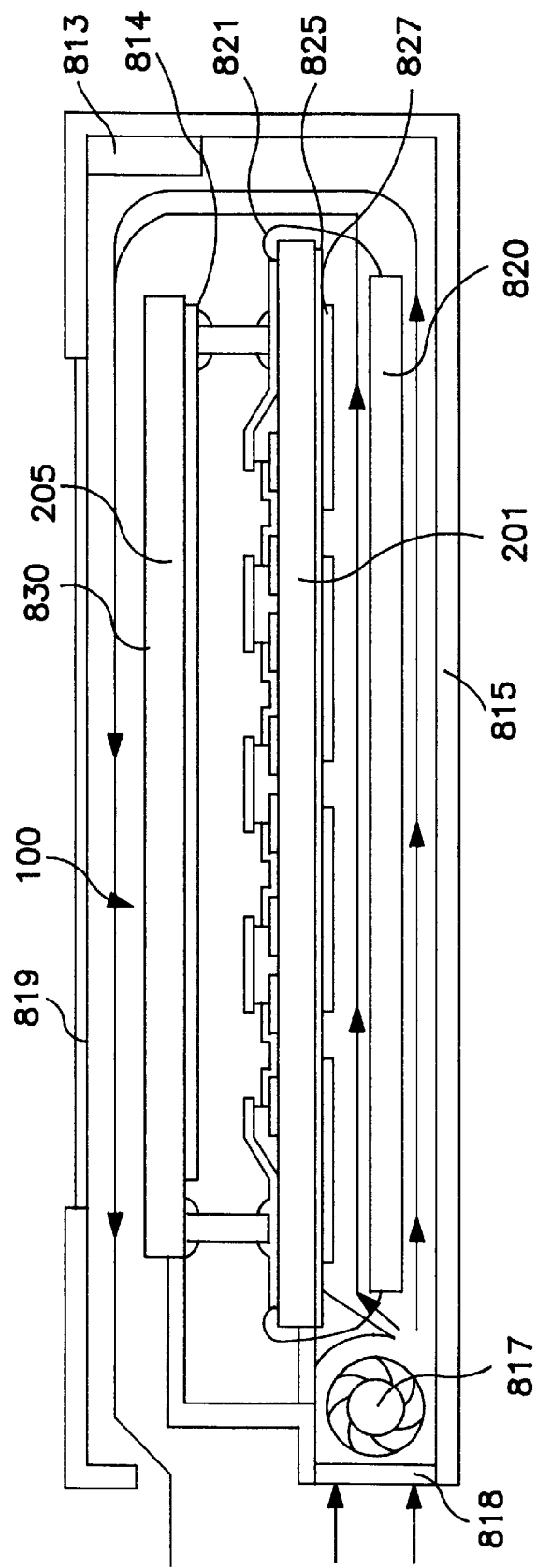
FIG. 8 is a schematic cross-sectional side view of still another embodiment of image display apparatus according to the invention and comprising fins and an electric fan.

In FIG. 8, there are shown a thermally conductive transparent film 830 arranged on the face plate as a coat for achieving a flat temperature profile and an anti-reflection effect for the face plate and preventing electrically charged dirt particles from adhering to the face plate, a fan 817 for generating a lateral air flow at a rate of 5 m$^3$/minute, a metal film 825 of thermally conductive Ag formed on the back side of the rear plate and a number of fins 827 made of Ag and arranged on the metal film 825. Otherwise, the apparatus of this example had a configuration the same as its counterpart of the second example.

The display panel 100 of this example comprising a face plate, a lateral frame and a substrate was prepared and operated for displaying images exactly the same as that of the display panel of the first example. The transparent film 830 on the surface of the face plate was formed by vacuum deposition and by applying ITO/SnO$_2$.

The metal film 825 of Ag was formed on the back side of the rear plate and then the fins 827 were formed on the metal film 825 by screen printing. The metal film 825 had a thickness of about 20 $\mu$m and each of the fins 827 had a height, a width and a length of tens of several $\mu$ms, 1 mm and 5 mm. The thermal conductivity of the metal film 825 was about 430 W/mK and since it was greater than that (1.1 W/mK) of the rear plate (soda lime plate), heat was transmitted through the metal film 825 to produce a flat and even temperature profile for the rear plate. The anti-dirt film 830 arranged on the face operated effectively for preventing fine particles of dirt from adhering to the face plate and also for providing an improved temperature profile for the face plate if compared with a display panel 100 without an anti-dirt film 830. Additionally, it was proved that the heat generated in the display panel 100 could be effectively transmitted through the fins 827 on the metal film 825 and dispersed into the cooling air coming from the fan 817 and that the ICs in the drive circuits 820 were also effectively cooled.

The arrangement of this example operates for cooling in a manner as described below.

The external air drawn into the apparatus by means of the laterally arranged fan 817 is cleaned by the filter 818 to get rid of dirt and the cleaned air is made to flow along the arrowed lines 816. Consequently, the cooling air cools the metal film 825 and the fins 827 on the back side of the substrate 201 of the display panel 100 while it raises its own temperature. Thereafter, the cooling air turns around the face plate 205 of the display panel 100 and passes between the face plate 205 and the screen cover 819, exchanging heat with the ITO/SnO$_2$ film on the face plate 205 so that the temperature of the face plate 205 is lowered close to that of the cooling air.

In an experiment, the apparatus was operated for an hour, when the temperature profile of the apparatus was stabilized, and then the temperature of the face plate 205 and that of the substrate 201 were measured to find that they showed a difference substantially the same as the corresponding difference observed in the first example. Furthermore, after operating it for a long time, no color breakup was observed in the peripheral areas of the screen and the apparatus was completely free from damage. It was found that the cooling effect of the apparatus was further improved if Ag arranged on the back side of the rear plate was replaced by Cu.

Since the drive circuit 820 of this example was enclosed in the housing 815 of the apparatus of this example as in the case of the fourth example, the apparatus offered an improved convenience of handling because it operated simply by feeding it with image display signals.

The ITO/$SnO_2$ film may be formed by a method other than vacuum deposition as described above such as printing or spraying. The transparent film 830 provides an anti-shrink effect and an improved stability of the apparatus. Note that the face plate may be covered with an opaque film except the area where images are actually displayed.

(EXAMPLE 6)

Figure 9:
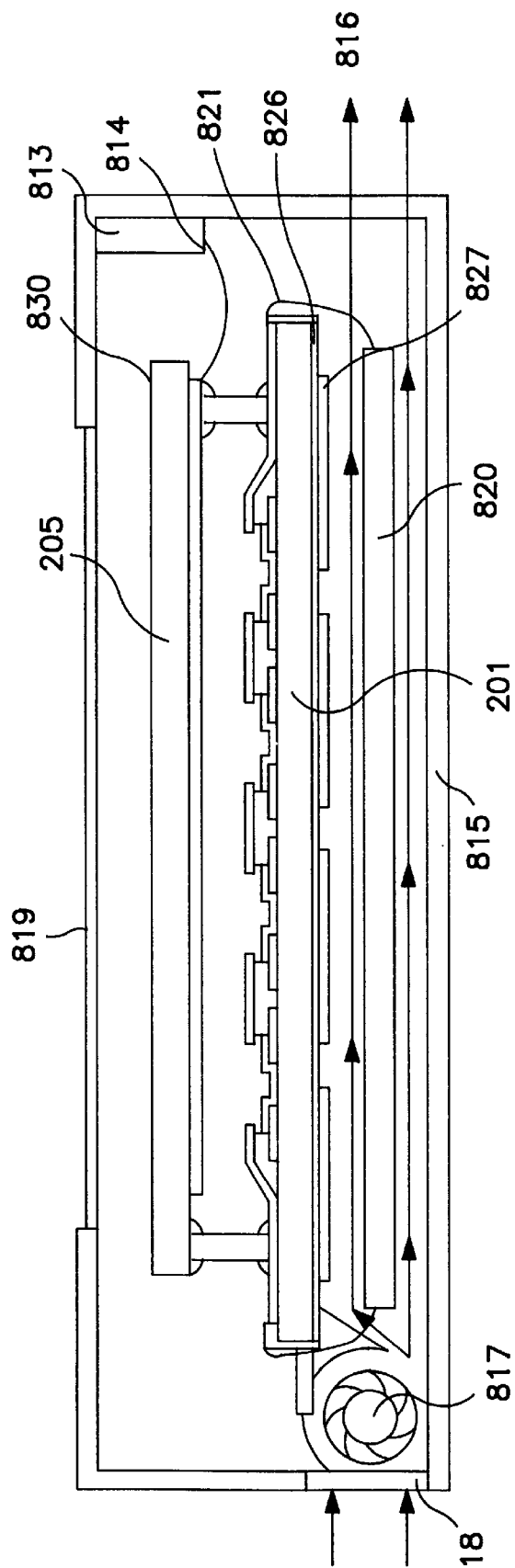
FIG. 9 is a schematic cross-sectional side view of still another embodiment of image display apparatus according to the invention and comprising fins and an electric fan.
Figure 10:
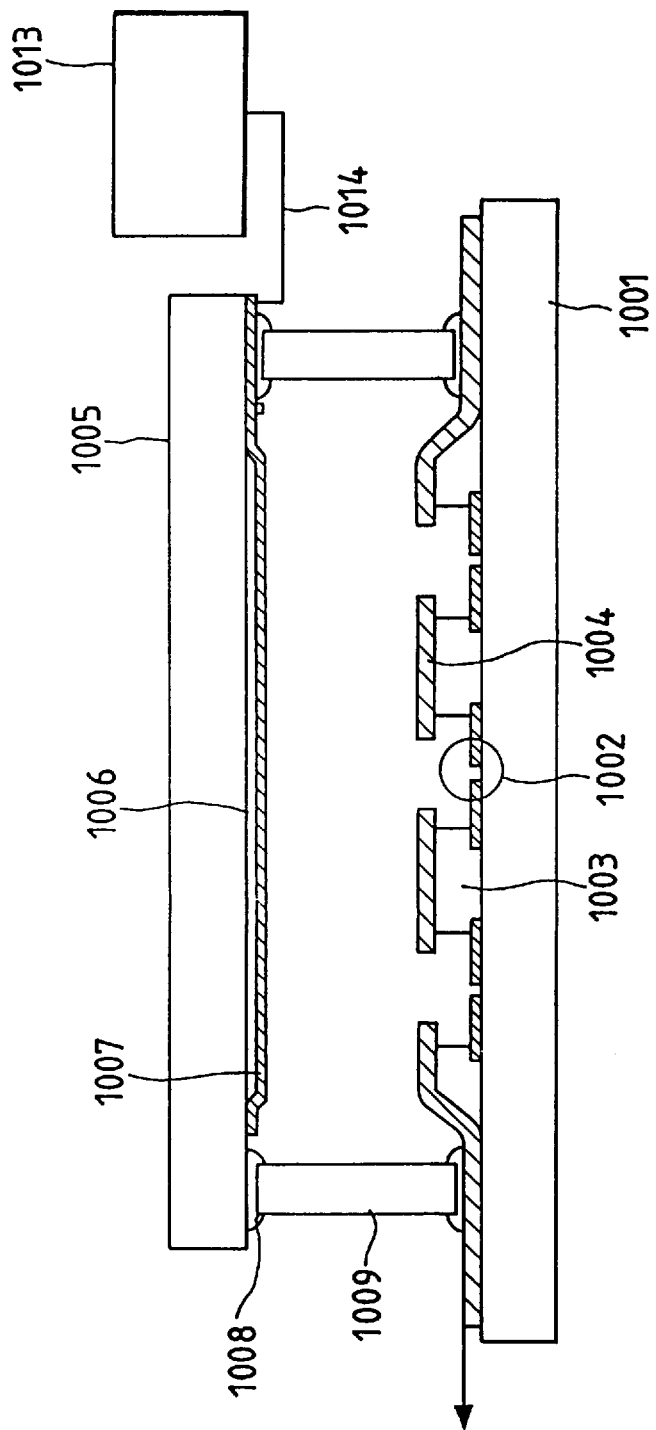
FIG. 10 is a schematic cross-sectional side view of an image display apparatus comprising surface conduction electron-emitting devices.
Figure 11:
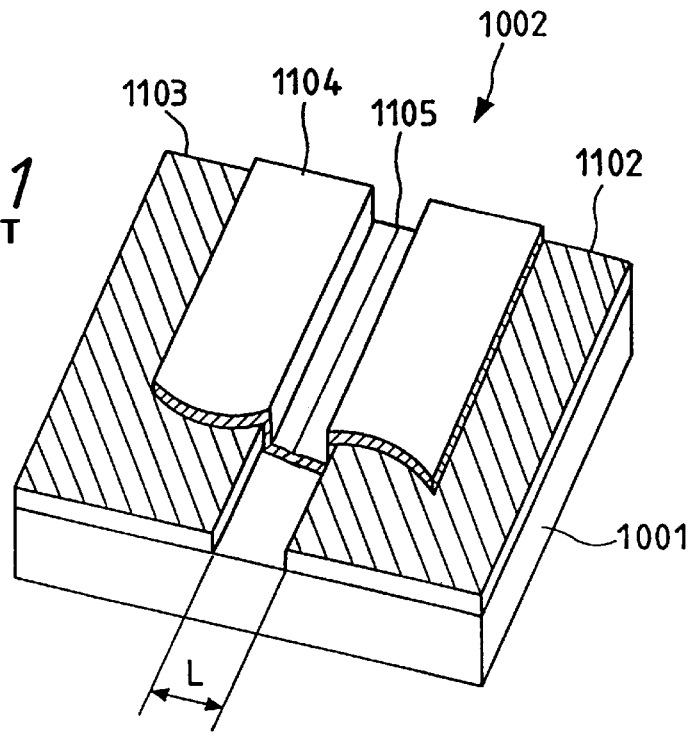
FIG. 11 is a schematic perspective view of a surface conduction electron-emitting device.

In this example, the entire surface of a display panel comprising a face plate, a lateral frame and a rear plate was coated with a thermally conductive transparent film and a metal plate and (flat) fins having a thermal conductivity greater than that of the material of the rear plate (soda lime glass) were arranged on the rear plate in a manner as illustrated in FIG. 9.

Figure 12:
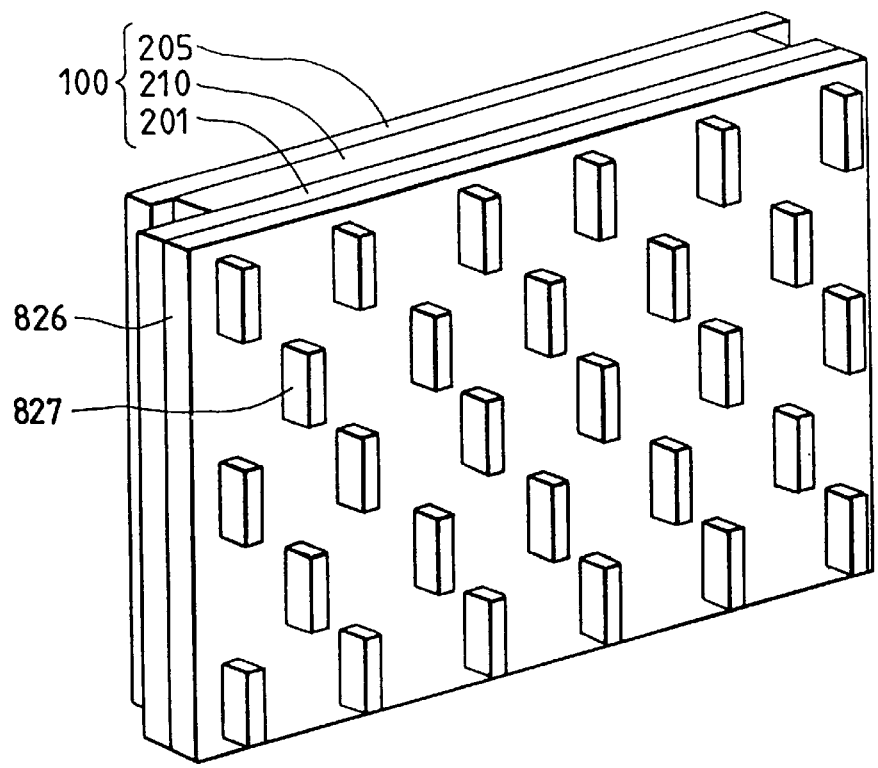
FIG. 12 is a schematic perspective view of the embodiment of FIG. 9, showing in particular the arrangement of the fins.

Referring to FIG. 9, reference numeral 830 denotes a thermally conductive transparent film formed on the entire surface of the display panel in order to achieve a flat and even temperature profile and avoid adhesion of electrically charged dirt particles. The extended electrode section was also coated with the transparent film 830 after it was covered by an insulation film (not shown) made of glass. The apparatus additionally comprised a side flow fan 817 having a blowing capacity of 5 $m^3$/minute and a thermally conductive aluminum plate 826 arranged on the rear plate and a number of aluminum fins 827 arranged on the metal plate 826. The fins 827 were longitudinally aligned with the direction of the air flow in the apparatus. FIG. 12 shows a schematic perspective view of the aluminum plate 826 and the aluminum fins 827. Otherwise, the apparatus was identical with that of the second example.

The display panel 100 comprising a face plate, a lateral frame and a rear plate of the apparatus of this example was prepared and operated for displaying images exactly the same as its counterpart of the first example. The transparent film 830 on the entire surface of the display panel was formed by vacuum deposition and by applying ITO/$SnO_2$.

As for the aluminum plate 826 and the fins 827 arranged on the aluminum plate 826, the former had a thickness of 3 mm whereas each of the fins 827 had a height, a width and a length of 3 mm, 2 mm and 10 mm respectively. Since the metal plate 826 had a thermal conductivity of about 190 W/mK which was by far greater than that of the rear plate (1.1 W/mK) of soda lime glass, heat was transmitted through the metal plate 826 to realize a flat and even temperature profile for the rear plate. Note that the metal plate 826 may be arranged not only on the back side of the rear plate but also the lateral frame and the face plate 205 except the area for displaying images and that it is recommendable to arrange a large metal plate 826 unless it disadvantageously increases the total weight of the apparatus. It was proved that the anti-dirt film 830 on the face plate could effectively prevent particles of dirt from adhering thereto and the temperature profile of the face plate was improved if compared with an apparatus having no such film. It was also proved that the heat generated in the display panel 100 could be effectively transmitted through the fins 827 on the metal film 826 and dispersed into the cooling air coming from the side flow fan 817 and that the ICs in the drive circuits 820 were also effectively cooled. Since the fins 827 of the apparatus of this example were longitudinally aligned with the direction of the air flow in the apparatus, the heat dispersing effect of the apparatus was further improved.

The arrangement of this example operates for cooling in a manner as described below.

The external air drawn into the apparatus by means of the side blow fan 817 is cleaned by the filter 818 to get rid of dirt and the cleaned air is made to flow along the arrowed lines 816. Consequently, the cooling air cools the metal film 826 and the fins 827 on the back side of the substrate 201 of the display panel 100 while it raises its own temperature. As the cooling air exchanges heat with the metal plate 826 and the fins 827 to a sufficient extent, heat flows mainly through the thermal conductive transparent film 830 arranged on the display panel as a function of the temperature gradient existing there until the display panel shows a very flat and even temperature profile.

In an experiment, the apparatus was operated for an hour, when the temperature profile of the apparatus was stabilized, and then the temperature of the face plate 205 and that of the substrate 201 were measured to find that they showed a difference substantially the same as the corresponding difference observed in the first example. Furthermore, after operating it for a long time, no color breakup was observed in the peripheral areas of the screen and the apparatus was completely free from damage.

Since the drive circuit 820 of this example was enclosed in the housing 815 of the apparatus of this example as in the case of the fourth example, the apparatus offered an improved convenience of handling because it operated simply by feeding it with image display signals.

The ITO/$SnO_2$ transparent film 830 may be formed by a method other than vacuum deposition as described above such as printing or spraying. Note that the face plate may be covered with an opaque film except the area where images are actually displayed. Note also that the lateral frame and other components may be covered by an Ag film as in the case of the fifth example except the area for displaying images.

The fins 827 may have a profile more complicated than the above described one. Additionally, fins may be formed on the existing fins in order to increase the surface area to be exposed to the cooling air, although the pressure loss on the part of the fan increases with the increase in the surface area to reduce the air flow rate. So, the profile of the fins and the surface area to be exposed to the cooling air have to be appropriately selected, taking the contour of the air flow paths into consideration.

What is claimed is:

1. An image display apparatus comprising:
    a display panel formed by arranging in juxtaposition a face plate carrying thereon a phosphor and a rear plate carrying thereon electron-emitting devices, said phosphor being so arranged as to be irradiated with electrons emitted from said electron-emitting devices to display images;
    a housing containing said face plate and said rear plate, said housing having a flow path connecting a space in contact with said rear plate with a space in contact with said face plate; and
    air blowing means for causing air to flow through said flow path.

2. An image display according to claim 1, wherein a thermally conductive member having a higher thermal conductivity than said rear plate is arranged on a surface of said rear plate opposite to a surface carrying said electron-emitting devices.

3. An image display apparatus according to claim 1, wherein a thermally conductive, transparent member having a higher thermal conductivity than said face plate is arranged on a surface of said face plate opposite to a surface carrying thereon said phosphor.

4. An image display apparatus according to claim 3, wherein said thermally conductive, transparent member is an anti-reflection film.

5. An image display apparatus according to claim 3, wherein said thermally conductive, transparent member is an anti-static film.

6. An image display apparatus according to claim 3, wherein said thermally conductive, transparent member is an anti-reflection, anti-static film.

7. An image display apparatus according to claim 1, wherein said display panel is constructed by bonding said rear plate and said face place with a lateral frame arranged therebetween, a first thermally conductive member having a higher thermal conductivity than said rear plate is arranged on a surface of said rear plate opposite to a surface carrying thereon said electron-emitting devices, a second thermally conductive member which is transparent and has a higher thermal conductivity than said face plate is arranged on a surface of said face plate opposite to a surface carrying thereon said phosphor, and said first and second thermally conductive members are connected with each other by a third thermally conductive member having a higher thermal conductivity than said lateral frame.

8. An image display apparatus according to claim 7, wherein said second thermally conductive member reduces reflection of ambient light.

9. An image display apparatus according to claim 7, wherein said second thermally conductive member is composed of an electroconductive material and thereby prevents adsorption of particles of dirt.

10. An image display apparatus according to claim 1, wherein a plurality of flat projections are arranged on said rear plate.

11. An image display apparatus according to claim 10, wherein longitudinal axes of said plurality of flat projections are arranged in parallel with the direction of air flow produced by said air blowing means.

12. An image display apparatus according to claim 1, wherein said air blowing means is arranged at a center of said housing facing said rear plate, and the air drawn by said air blowing means flows against said rear plate, then along said rear plate, then through the path and then along said face plate.

13. An image display apparatus according to claim 1, wherein said air blowing means is arranged in a lateral proximity of said display panel, and the air drawn by said air blowing means flows along the rear plate, then through the path and then along said face plate.

14. An image display apparatus according to claim 1, wherein a drive circuit for driving said display panel is arranged within said housing.

15. An image display apparatus according to claim 1, wherein the flow path connects a space in contact with said rear plate with a space in contact with a front surface of said face plate.

16. An image display apparatus according to claim 15, wherein the flow path connects a space in contact with a rear surface of said rear plate with a space in contact with said front surface of said face plate.

17. An image display apparatus according to claim 1, wherein said housing has a transparent member disposed opposite to said face plate.

18. An image display apparatus according to claim 17, wherein said transparent member is an acryl plate.

19. An image display apparatus according to claim 17, wherein said transparent member is coated with an anti-reflection optical film.

20. An image display apparatus according to claim 17, wherein said transparent member is laminated with an anti-scattering plastic film.

21. An image display apparatus according to any of claims 1 through 8 and 10 through 20, wherein said electron-emitting devices are surface conduction electron-emitting devices.

22. An image display apparatus according to any of claims 1 to 14 and 15 to 20, wherein said electron emitting devices are thermoelectron sources.

23. An image display apparatus according to any of claims 1 to 14 and 15 to 20, wherein said electron emitting devices are field emission electron-emitting devices.

24. An image display apparatus comprising:
a display panel formed by arranging in juxtaposition a face plate carrying thereon a phosphor and a rear plate carrying thereon electron-emitting devices, said display panel having an outer surface on which a thermally conductive member having a higher thermal conductivity than said face plate and said rear plate is arranged;
a housing containing said display panel, said display panel being arranged within said housing in such a manner that a space is formed between said rear plate and an inner wall of said housing; and
air blowing means for causing air to flow through said space.

25. An image display apparatus comprising:
a display panel formed by arranging in juxtaposition a face plate carrying thereon a phosphor and a rear plate carrying thereon electron-emitting devices;
a housing containing said display panel, said display panel being arranged within said housing in such a manner that a space is formed between said rear plate and a wall of said housing facing said rear plate, said housing having an opening in a wall of said housing facing said face plate; and
air blowing means for causing air to flow through said space.

26. An image display apparatus comprising:
a display panel formed by arranging in juxtaposition a face plate carrying thereon a phosphor and a rear plate carrying thereon electron-emitting devices, said display panel having an outer surface on which a thermally conductive member having a higher thermal conductivity than said face plate and said rear plate is arranged;
a housing containing said display panel, said display panel being arranged within said housing in such a manner that a space is formed between said rear plate and an inner wall of said housing;
a driving circuit for driving said display panel, said driving circuit being arranged within said space; and
air blowing means for causing air to flow through said space.

27. An image display apparatus comprising:
a display panel formed by arranging in juxtaposition a face plate carrying thereon a phosphor and a rear plate carrying thereon electron-emitting devices;

a housing containing said display panel, said display panel being arranged within said housing in such a manner that a space is formed between said rear plate and a wall of said housing facing said rear plate, said housing having an opening in a wall of said housing facing said face plate;

a driving circuit for driving said display panel, said driving circuit being arranged within said space; and air blowing means for causing air to flow through said space.

* * * * *

UNITED STATES PATENT AND TRADEMARK OFFICE
CERTIFICATE OF CORRECTION

PATENT NO. : 5,869,919

DATED : February 9, 1999

INVENTOR(S) : Sato et al.

It is certified that error appears in the above-identified patent and that said Letters Patent is hereby corrected as shown below:

Title page, item

[56] REFERENCES CITED:

FOREIGN PATENT DOCUMENTS, "3261024" should read --3-261024--.

COLUMN 1:

Line 15, "paid" should read --made--.

COLUMN 15:

Line 17, "place" should read --plate--.

COLUMN 16:

Line 14, "1 to 14" and 15 to 20," should read --1 to 8 and 10 to 20,--.
Line 18, "1 to 14" and 15 to 20," should read --1 to 8 and 10 to 20,--.